US009439321B2

(12) United States Patent
Chen

(10) Patent No.: US 9,439,321 B2
(45) Date of Patent: Sep. 6, 2016

(54) SLIDE FOR INDUSTRIAL COMPUTER RACK

(71) Applicant: MARTAS PRECISION SLIDE CO., LTD., New Taipei (TW)

(72) Inventor: Wan-Lai Chen, New Taipei (TW)

(73) Assignee: Martas Precision Slide Co., Ltd., New Taipei (TW)

( * ) Notice: Subject to any disclaimer, the term of this patent is extended or adjusted under 35 U.S.C. 154(b) by 241 days.

(21) Appl. No.: 14/044,039

(22) Filed: Oct. 2, 2013

(65) Prior Publication Data

US 2015/0093054 A1  Apr. 2, 2015

(51) Int. Cl.
*H05K 7/18* (2006.01)
*A47B 88/14* (2006.01)
*H05K 7/14* (2006.01)

(52) U.S. Cl.
CPC ............. *H05K 7/1489* (2013.01); *A47B 88/14* (2013.01); *H05K 7/183* (2013.01)

(58) Field of Classification Search
CPC .... A47B 88/14; A47B 88/16; A47B 88/044; A47B 88/10; A47B 2210/0016; A47B 2088/0444; H05K 7/183; H05K 7/1489; H02B 1/36
USPC ................. 312/334.4–334.5, 334.44–334.47, 312/319.1, 223.1, 265.1–265.4; 211/26, 211/192; 248/244
See application file for complete search history.

(56) References Cited

U.S. PATENT DOCUMENTS

| 8,231,188 | B1 * | 7/2012 | Chen et al. | 312/333 |
|---|---|---|---|---|
| 8,562,086 | B1 * | 10/2013 | Baik et al. | 312/334.4 |
| 2007/0170830 | A1 * | 7/2007 | Huang | 312/334.47 |
| 2008/0073469 | A1 * | 3/2008 | Mushan et al. | 248/205.1 |
| 2008/0111457 | A1 * | 5/2008 | Ji et al. | 312/334.44 |
| 2008/0124009 | A1 * | 5/2008 | Peng et al. | 384/21 |
| 2009/0096340 | A1 * | 4/2009 | Chen et al. | 312/334.46 |
| 2009/0114785 | A1 * | 5/2009 | Huang et al. | 248/220.31 |
| 2009/0167127 | A1 * | 7/2009 | Chen et al. | 312/334.1 |
| 2010/0019638 | A1 * | 1/2010 | Duan et al. | 312/334.44 |
| 2010/0072153 | A1 * | 3/2010 | Chen et al. | 211/183 |

* cited by examiner

*Primary Examiner* — Daniel J Troy
*Assistant Examiner* — Ryan A Doyle
(74) *Attorney, Agent, or Firm* — Rosenberg, Klein & Lee

(57) ABSTRACT

A slide for an industrial computer rack includes a telescopic frame, a pair of fastener sets, a slide set, an automatic locking module and a release module. The industrial computer rack is a rectangular box composed of frameworks and side panels, and each vertically erected framework has equidistant latch holes. The length of the slide can be adjusted by changing the length of the telescopic frame according to the distance between any two frameworks, and the fastener sets are installed at two end portions of the telescopic frame respectively for a quick installation. The slide set is integrated with the automatic locking module, and the release module includes a U-shaped rail, a release rod and a fixed block. The U-shaped rail is locked onto the exterior of the industrial computer and movably disposed across the telescopic frame, so that the industrial computer can be locked automatically and released quickly.

5 Claims, 8 Drawing Sheets

SLIDE FOR INDUSTRIAL COMPUTER RACK

BACKGROUND OF THE INVENTION

1. Field of the Invention

The present invention relates to the technical field of industrial computer rack, and more particularly to a slide dedicated for industrial computer rack, and the slide can be assembled conveniently and removed quickly for repair and maintenance.

2. Description of the Related Art

In general, an industrial computer chassis comes with the size of 1U, 2U or 3U, and the industrial computer chassis is placed horizontally in an industrial computer rack, so that the industrial computer rack has a plurality of vertical frameworks, and each framework has a plurality of fixing holes or screw holes for mounting at least one industrial computer horizontally between the frameworks through fixed blocks or fixing screws, such that the industrial computers can be stacked on one another.

In actual installation, the fixing holes or screw holes of the frameworks come with different positions or sizes, so that it is necessary to used the fixed blocks or fixing screws with the corresponding positions or sizes. After the installation is completed, it is necessary to remove the fixed blocks or fixing screws for the next repair or maintenance, and thus the conventional industrial chassis is quite inconvenience for use. Therefore, a pull-out slide is usually installed between the industrial computer rack and the industrial computer to overcome the aforementioned problem, since the pull-out slide has a pull-to-stretch and stack-to-retract feature. With a two-stage or three-stage design of the slide, the industrial computer can be pushed into the industrial computer rack, or the industrial computer can be pulled out from the industrial computer rack for expansion, replacement, inspection or maintenance.

At present, the slide is generally installed by screws. Since it is necessary to use a plurality of fixing screws to be used in a same framework, therefore the installation or removal of the fixing screws is relatively troublesome. Another design for installing the slide is by cross-setting, wherein both ends of the slide have a fastener set capable of passing through the fixing holes of the frameworks. The weight of the industrial computer keeps the slide to be fixed between the frameworks, or a single screw is used for fixing the slide in order to improve the convenience of the installation. However, different industrial computer racks have fixing holes of different sizes, shapes or even distances between the frameworks, so that each type of conventional slides cannot be used universally for various kinds of computers, and a waste of development cost is resulted, not even mentioning that there is a design for facilitating the separation between the slide and the industrial computer or an automatic locking design when the slide is closed to a certain extent.

SUMMARY OF THE INVENTION

Therefore, it is a primary objective of the present invention to overcome the problems of the prior art by providing a slide for an industrial computer rack, wherein a telescopic frame that can be installed quickly, a slide set of an automatic locking module, and a release module coupled between the telescopic frame and the slide set are provided for improving the installation efficiency and stability significantly, while providing an automatic locking effect when the slide is closed, so as to prevent the slide from falling off, and removing an industrial computer from the slide set quickly.

To achieve the aforementioned objective, the present invention provides a slide for an industrial computer rack for connecting an industrial computer rack and an industrial computer, wherein the industrial computer rack is a rectangular box comprised of a plurality of frameworks and a plurality of side panels, and each vertically erected framework has a plurality of equidistant latch holes, and the slide for the industrial computer rack is horizontally installed between the two frameworks, and the slide comprises: a telescopic frame, comprised of a first moving part and a second moving part, and the first moving part having a containing space formed therein for movably installing the second moving part therein, so that the second moving part can be moved with respect to the first moving part to adjust the length of the telescopic frame; a pair of fastener sets, installed at two end portions of the telescopic frame respectively for horizontally mounting the telescopic frame between two adjacent frameworks, and each fastener set having a base corresponding to the latch holes of the frameworks, and each base having a pair of fasteners disposed on an end surface of the base, and the fasteners that can be movably adjusted according to the size of the latch holes of the latch holes being embedded into the latch holes respectively; a slide set, including an outer rail, at least one inner rail and a plurality of balls, and the outer rail being installed into the telescopic frame, and the inner rail being installed inside the outer rail, and the balls being clamped between the outer rail and the inner rail, such that the inner rail can be extended and retracted horizontally with respect to the outer rail, and the outer rail having a guide groove formed on an inner side of the outer rail, a positioning portion formed at an end portion of the guide groove, and the inner rail having a moving groove formed on the exterior of the inner rail and corresponding to the industrial computer, a slide stopper disposed in the moving groove, and a latch block disposed with an interval from a side of the inner rail and opposite to the slide stopper; an automatic locking module, including a slide block, a pressing plate and a first elastic element, and the slide block being slidably disposed and limited in the guide groove, and the pressing plate being installed outside the guide groove for pressing and preventing the slide block from falling out when the slide block is moving in the guide groove, and an end of the first elastic element being fixed to a side of the positioning portion, and the other end of the first elastic element being coupled to the slide block, so that after the slide block is triggered by the inner rail, the slide block is automatically locked to a set position in the outer rail; and a release module, including a U-shaped rail, a release rod and a fixed block, and a side of the U-shaped rail being secured to the exterior of the industrial computer and movably disposed across an edge of the second moving part, and the release rod and the fixed block being disposed at the top of the U-shaped rail, and the release rod being situated at an anterior position of the U-shaped rail, and the fixed block being disposed with an interval from a side of the release rod, so that after the fixed block is clamped by the slide stopper and the latch block, the fixed block coupled to the inner rail, and when use, the release rod pushes the slide stopper to move, and the U-shaped rail can be removed from the second moving part.

In a preferred embodiment of the present invention, the first moving part and the second moving part are C-shaped metal troughs, and the second moving part has a size smaller than the size of the first moving part, so that a movable button can be extended or retracted reciprocally with respect to the first moving part to adjust the length of the telescopic frame.

In addition, the fastener includes a moving block, a central column and a second elastic element, and the moving block is movably disposed in an opening formed on an end surface of the base and has its interior connected to the second elastic element, and a penetrating hole is formed at the center of the moving block for sheathing the central column, so that the moving block can be extended or retracted with respect to the base, and when the moving block is retracted, the central column is exposed, so that the moving block or the central column can be passed into the latch holes. The moving block is divided into a first section and a second section arranged in a cascade form, and the first section is a rectangular block, and the second section is a cylindrical block, and the opening is in a rectangular shape for accommodating a portion of the first section, and the second section is normally exposed to the outside, and a first embedding groove is formed on a surface of the first section, and a second embedding groove is formed on a surface of the second section, and the first embedding groove or the second embedding groove is embedded into the latch hole by the weight of the industrial computer for fixing and preventing the moving block from falling out.

In addition, the inner rail has a trigger block corresponding to the slide block, and the slide block has a notch portion disposed at the periphery of the slide block and corresponding to the trigger block, and after the trigger block pushes the slide block to turn, the trigger block falls into the notch portion, and the slide block is pulled by the first elastic element to slide in the guide groove, so as to pull the inner rail to be received automatically and prevent the inner rail from falling out after the industrial computer is opened.

It is noteworthy that the slide stopper is disposed slantingly in the moving groove and tilted towards an inner end of the slide set, and normally situated at a bottom position of the moving groove due to the gravitational force. The slide stopper resumes its original position after being propped by the fixed block, so that the rails are clamped for connecting the inner rail of the U-shaped rail. In addition, the release rod has an abutting portion slantingly bent and disposed at a position corresponding to an end portion of the fixed block, and the abutting portion is tilted towards an outer end of the slide set and provided for abutting the slide stopper to displace upwardly.

Therefore, the fixed block can be retracted from the slide stopper to release the connection between the U-shaped rail and the inner rail.

DETAILED DESCRIPTION OF THE PREFERRED EMBODIMENTS

Figure 1:
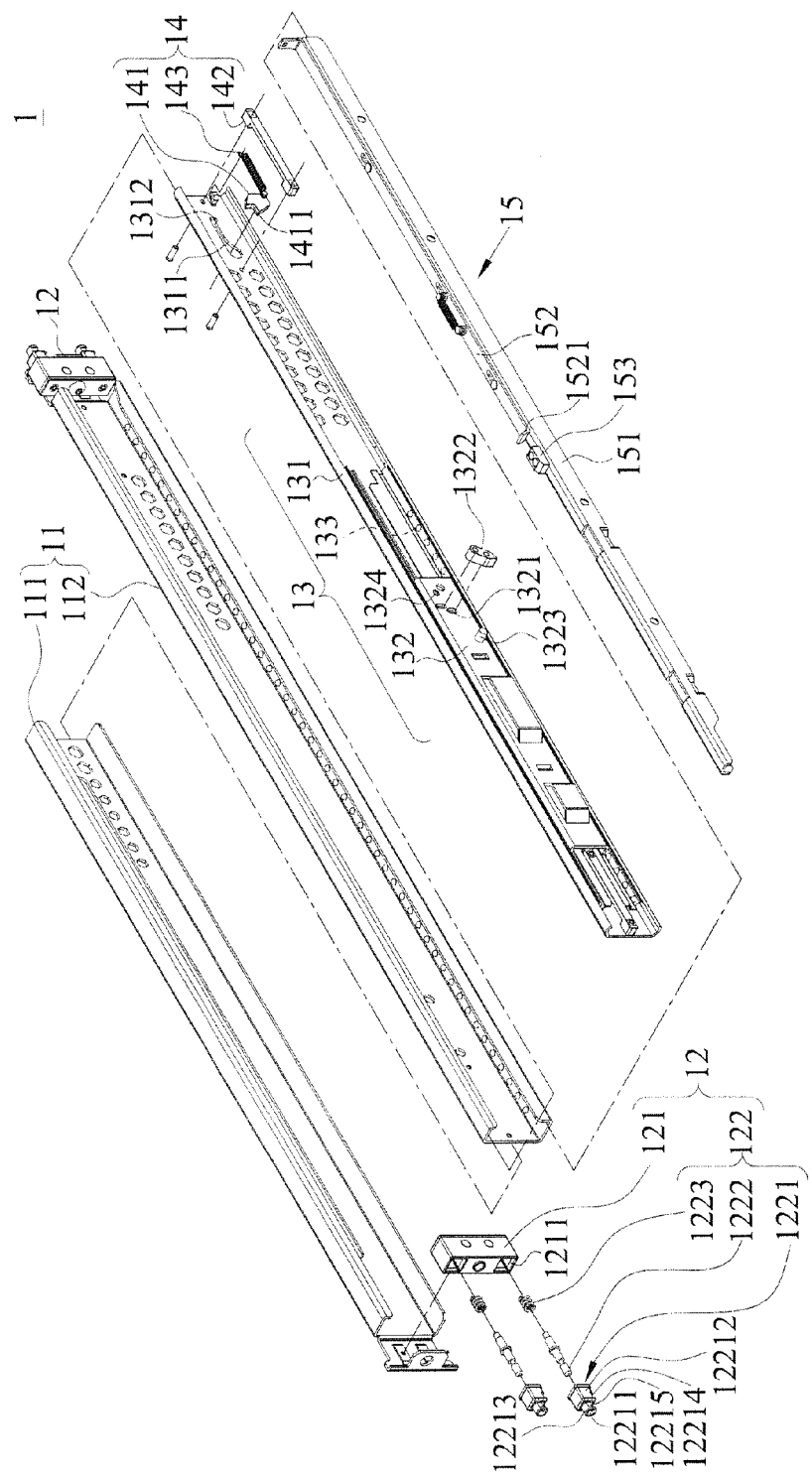
FIG. 1 is a schematic exploded view of the assembly of a preferred embodiment of the present invention.
Figure 2:
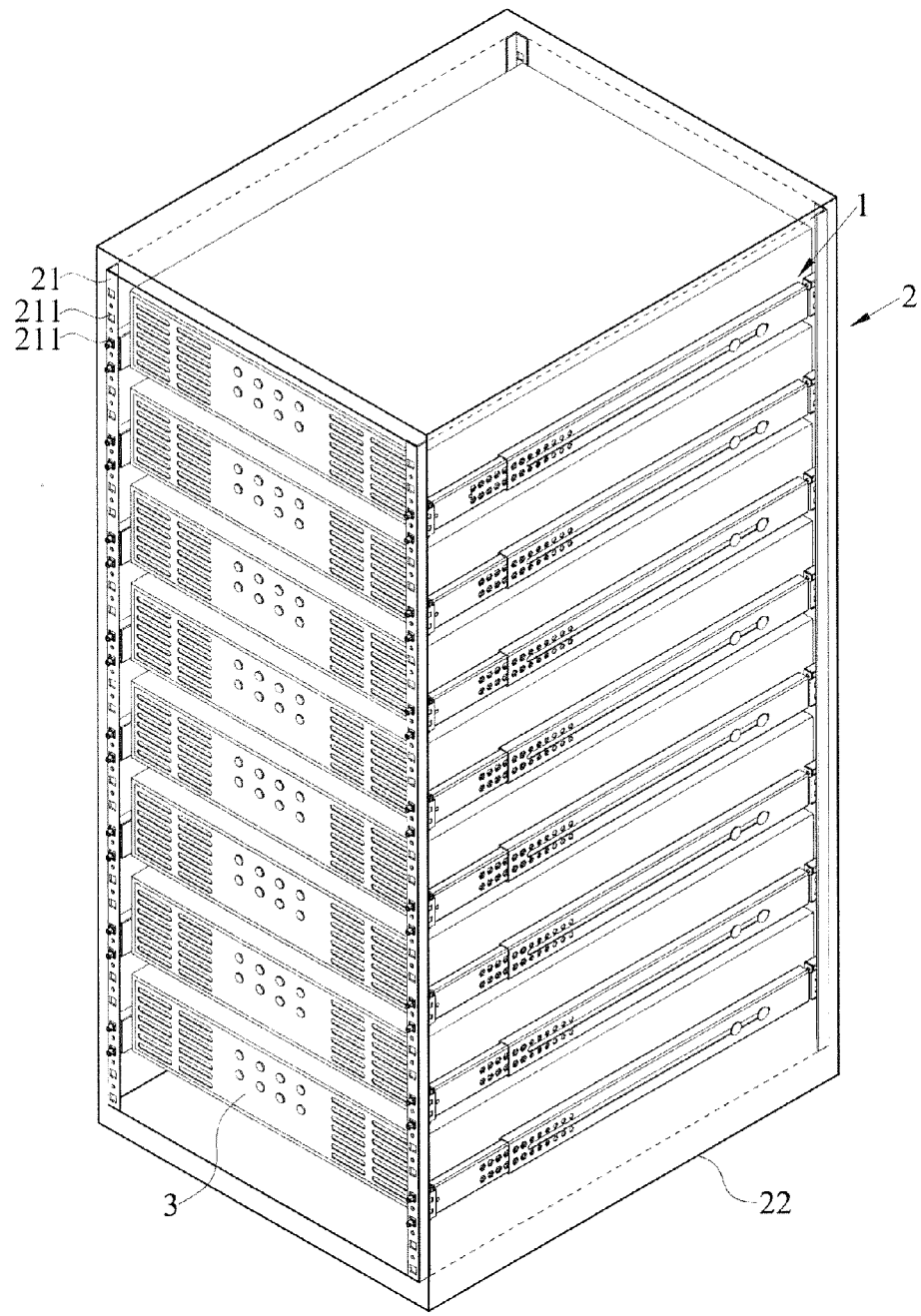
FIG. 2 is a perspective view of the assembly of a preferred embodiment of the present invention.

The aforementioned and other objectives, technical characteristics and advantages of the present invention will become apparent with the detailed description of preferred embodiments and the illustration of related drawings as follows.

With reference to FIGS. 1, 2 and 3 to 8 for a schematic view of a structure and a perspective view of an assembly as well as schematic views of different operations of a preferred embodiment of the present invention respectively, a slide for an industrial computer rack 1 of the present invention comprises a telescopic frame 11, a pair of fastener sets 12, a slide set 13, an automatic locking module 14 and a release module 15, for connecting an industrial computer rack 2 and an industrial computer 3, wherein the industrial computer rack 2 is a rectangular box comprised of a plurality of frameworks 21 and a plurality of side panels 22, and each vertically erected framework 21 has a plurality of equidistant latch holes 211, and the slide for an industrial computer rack 1 is horizontally installed between the two frameworks 21.

Wherein, the telescopic frame 11 is composed of a first moving part 111 and a second moving part 112, and the first moving part 111 and the second moving part 112 are C-shaped metal troughs, and the second moving part 112 has a size smaller than the size of the first moving part 111, and a containing space is formed in the first moving part 111 for movably installing the second moving part 112 therein, so that the second moving part 112 can be moved with respect to the first moving part 111 to adjust the length of the telescopic frame 1.

The pair of fastener sets 12 are disposed at two end portions of the telescopic frame 11 respectively and provided for mounting the telescopic frame 11 horizontally between two adjacent frameworks 21, wherein each fastener set 12 has a base 121 corresponding to each of the corresponding latch holes 211 of the frameworks 21, and each base 121 has a pair of fasteners 122 disposed at an end surface of the base 121, and the fasteners 122 can be movably adjusted according to the size of the latch holes 211 and embedded into the latch holes 211. Each fastener 122 includes a moving block 1221, a central column 1222 and a second elastic element 1223, and the moving block 1221 is movably disposed in an opening 1211 formed on an end surface of the base 121, and the interior of the moving block 1221 is connected to the second elastic element 1223, and the moving block 1221 has a penetrating hole 12211 formed at the center of the moving block 1221 for sheathing the central column 1222 therein, so that the moving block 1221 can be extended or retracted with respect to the base 121. When the moving block 1221 is retracted, the central column 1222 is exposed. It is noteworthy that the moving block 1221 is divided into a first section 12212 and a second section 12213 arranged in a cascade form, and the first section 12212 is a rectangular block, and the second section 12213 is a cylindrical block, and the opening 1211 is in a rectangular shape for accommodating a portion of the first section 12212, and the second section 12213 is normally exposed to the outside, and a first embedding groove 12214 is formed on a surface of the first section 12212, and a second embedding groove 12215 is formed on a surface of the second section 12213, and the first embedding groove 12214 or the second embedding groove 12215 is embedded into the latch hole 211.

Figure 3:
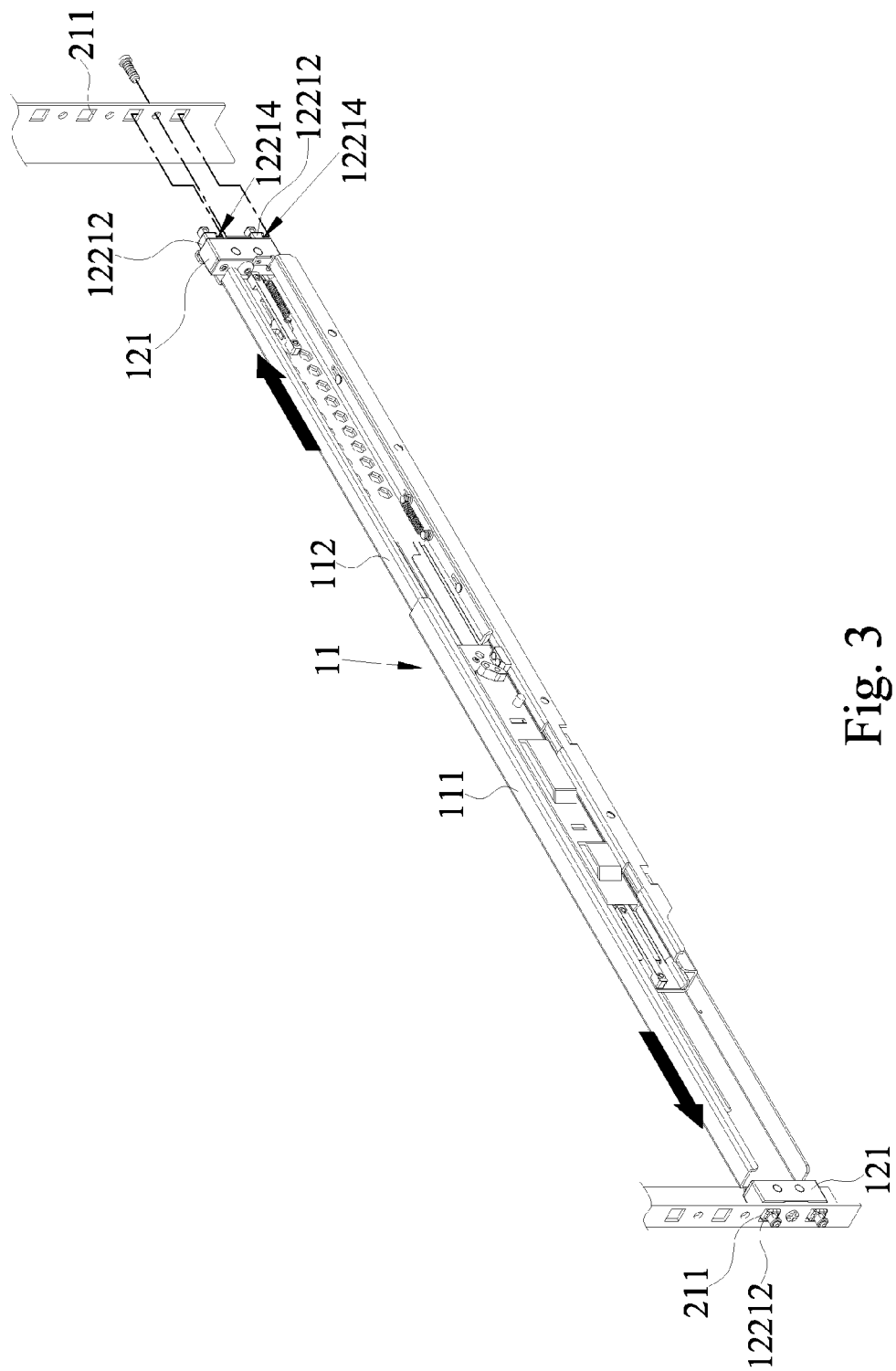
FIG. 3 is a first schematic view of a preferred embodiment of the present invention installed onto a framework.
Figure 4:
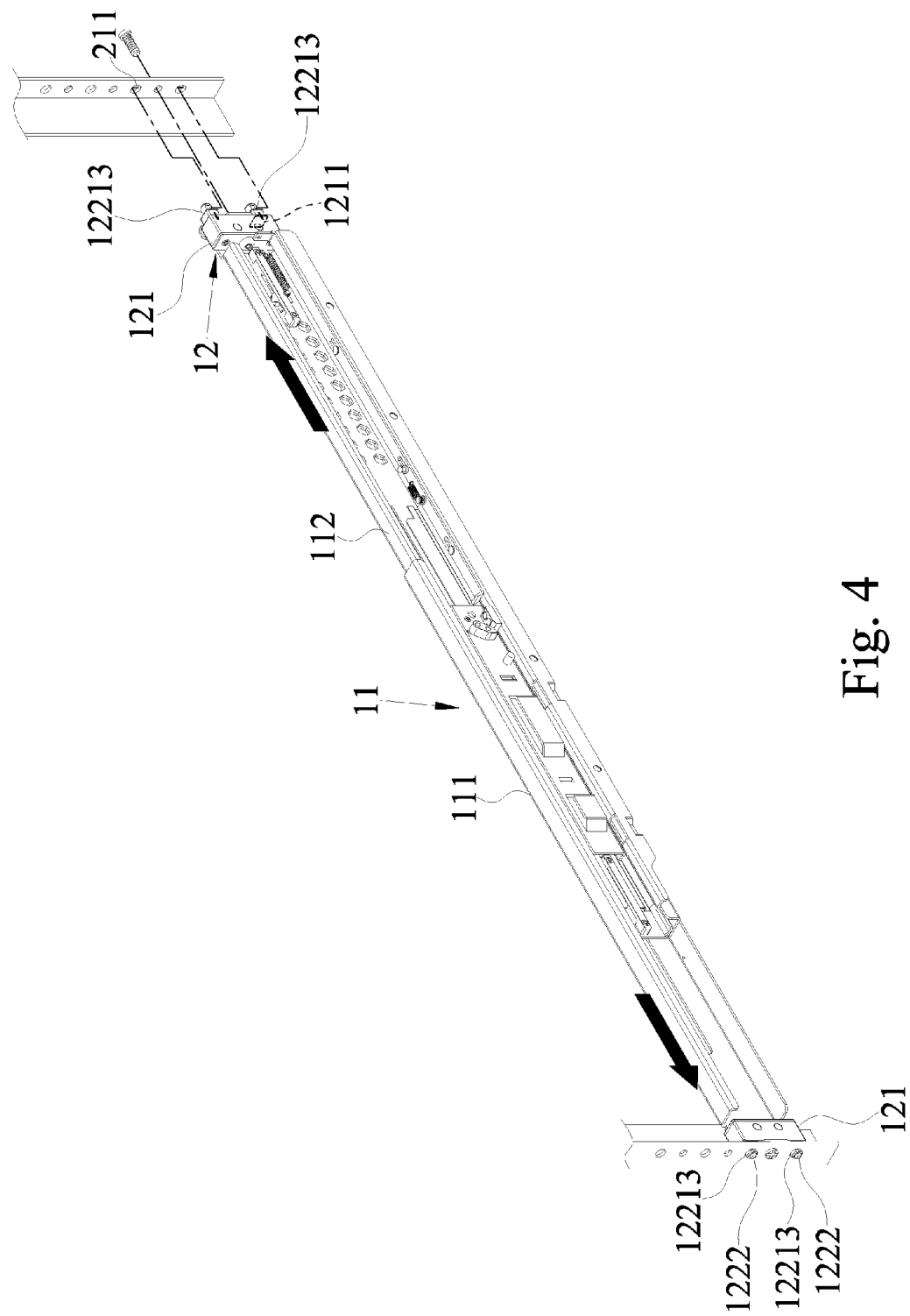
FIG. 4 is a second schematic view of a preferred embodiment of the present invention installed onto a framework.

With reference to FIGS. 3 and 4, for the installation into the rectangular latch hole 211, the first section 12212 of the fastener set 12 is embedded into the first embedding groove 12214 for a fixation: and for the installation into the circular latch hole 211, the first section 12212 is compressed to retract into the opening 1211 of the base 121, and the second section 12213 is embedded therein, or the central column 1222 is passed into the latch hole 211 to complete the assembly conveniently, and the slide can fit most of the industrial computer racks 2 available in the market.

The slide set 13 includes an outer rail 131, an inner rail 132 and a plurality of balls 133, wherein the outer rail 131 is installed in the telescopic frame 11, and the inner rail 132 is installed in the outer rail 131, and the balls 133 are clamped between the outer rail 131 and the inner rail 132, so that the inner rail 132 can be extended or retracted horizontally with respect to the outer rail 131. In addition, a guide groove 1311 is formed on an inner side of the outer rail 131, and a positioning portion 1312 is formed at an end portion of the guide groove 1311, and a moving groove 1321 is formed at the exterior of the inner rail 132 and corresponding to the industrial computer 3, and a slide stopper 1322 is disposed slantingly in the moving groove 1321 and tilted towards an inner end of the slide set 13, and the inner rail 132 has a latch block 1323 disposed with an interval from a side opposite to the slide stopper 1322.

Figure 5:
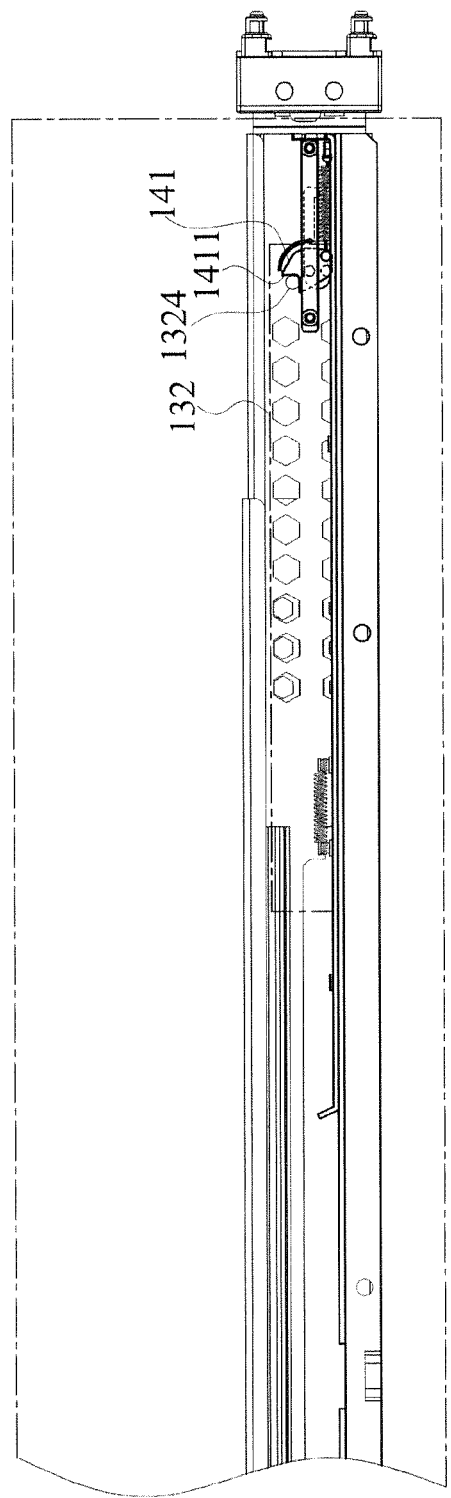
FIG. 5 is a first schematic view of an automatic locking status of a preferred embodiment of the present invention installed onto a framework.
Figure 6:
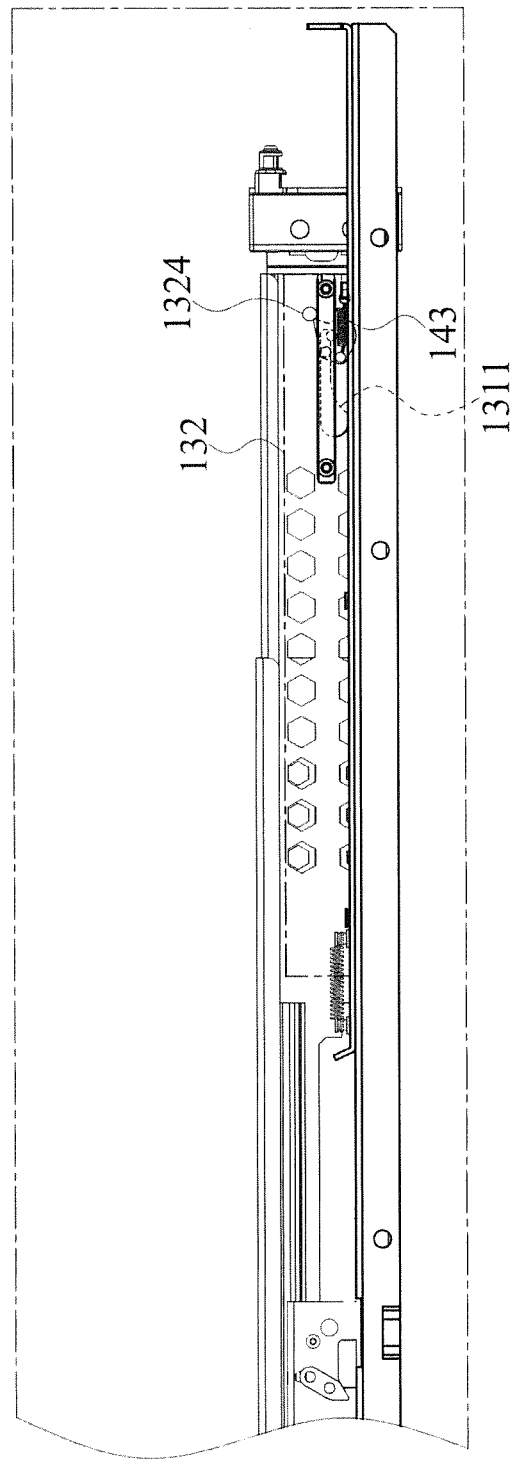
FIG. 6 is a second schematic view of an automatic locking status of a preferred embodiment of the present invention installed onto a framework.

The automatic locking module 14 includes a slide block 141, a pressing plate 142 and a first elastic element 143, wherein the slide block 141 is slidably installed and limited in the guide groove 1311, and the pressing plate 142 is installed at the exterior of the guide groove 1311 for pressing and preventing the slide block 141 from falling out when the slide block 141 is moving in the guide groove 1311, and an end of the first elastic element 143 is fixed to a side of the positioning portion 1312, and the other end of the first elastic element 143 is coupled to the slide block 141, such that after the slide block 141 is triggered by the inner rail 132, the slide block is automatically locked at a set position in the outer rail 131, and thus the slide block 141 will not fall out when the industrial computer 3 is pulled open. In FIGS. 5 and 6, the inner rail 132 of the present invention has a trigger block 1324 corresponding to the slide block 141, and the slide block 141 has a notch portion 1411 formed at the periphery of the slide block 141 and corresponding to the trigger block 1324. After the trigger block 1324 pushes the slide block 141 to turn, the trigger block 1324 falls into the notch portion 1411, and the slide block 141 is pulled by the first elastic element 143 to slide in the guide groove 1311, so as to pull the inner rail 132 to complete the locking process automatically.

Figure 7:
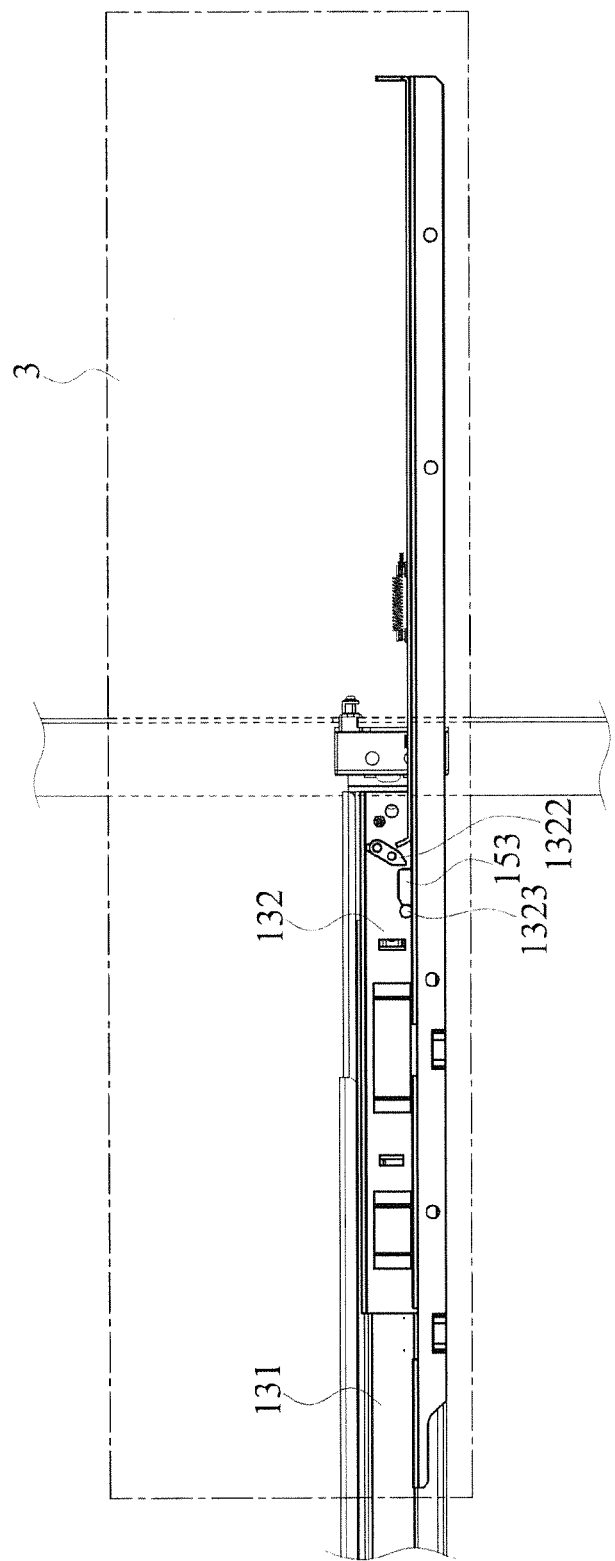
FIG. 7 is a first schematic view of a releasing status of a preferred embodiment of the present invention installed onto a framework.
Figure 8:
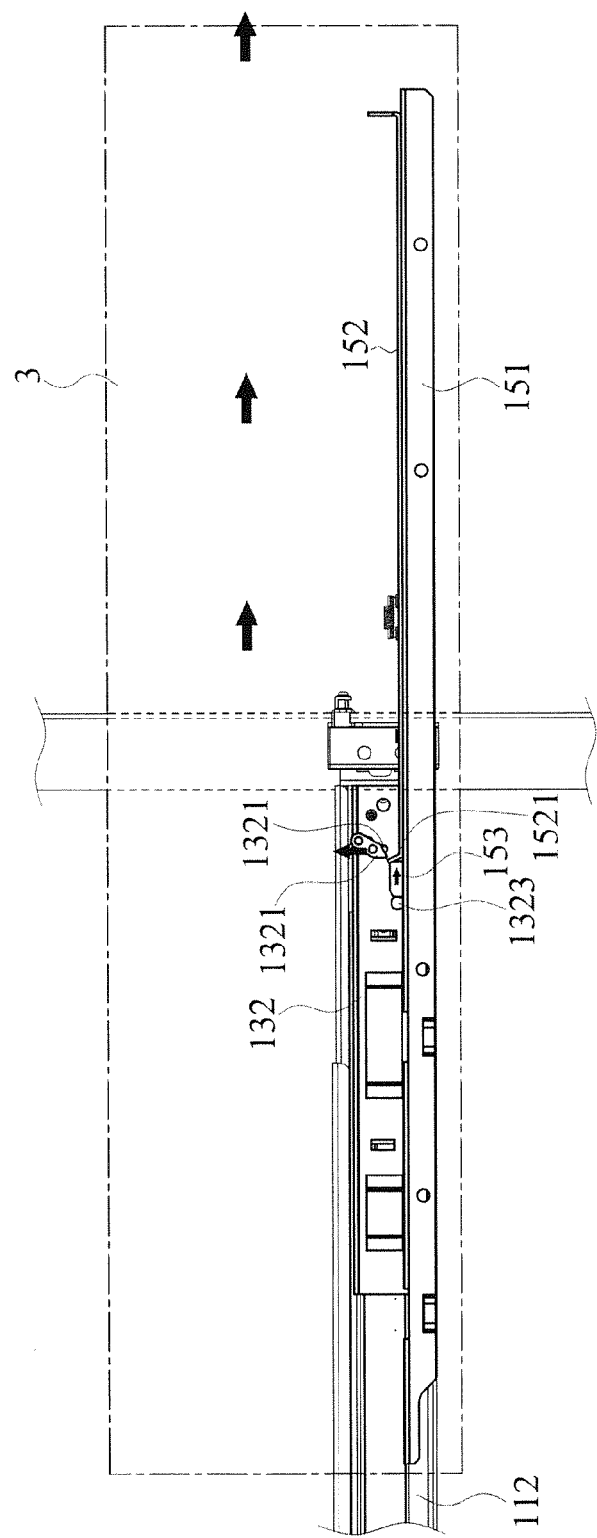
FIG. 8 is a second schematic view of a releasing status of a preferred embodiment of the present invention installed onto a framework.

The release module 15 includes a U-shaped rail 151, a release rod 152 and a fixed block 153, wherein a side of the U-shaped rail 151 is secured to the exterior of the industrial computer 3 and movably disposed across an edge of the second moving part 112, and the release rod 152 and the fixed block 153 are disposed at the top of the U-shaped rail 151, and the release rod 152 is situated at an anterior position of the U-shaped rail 151, and the fixed block 153 is disposed with an interval from a side of the release rod 152, and the release rod 152 has an abutting portion 1521 slantingly bent from an end portion of the release rod 152 corresponding to the fixed block 153 and the abutting portion 1521 is tilted towards an outer end of the slide set 13. In FIGS. 7 and 8, the fixed block 153 is clamped by the slide stopper 1322 and the latch block 1323, and then connected to the inner rail 132 during use, so that when the industrial computer 3 is pulled open, the inner rail 132 is driven synchronously to extend and move outwardly in the extending direction of the outer rail 131. When it is necessary to remove the industrial computer 3 for replacement or maintenance, the abutting portion 1521 of the release rod 152 is provided for pushing the slide stopper 1322 to move upwardly in the extending direction of the moving groove 1321, so that the fixed block 153 can be released from the slide stopper 1322 in order to remove the U-shaped rail 151 from the second moving part 112 and separate the industrial computer from the slide for an industrial computer rack 1.

What is claimed is:

1. An industrial computer rack with a plurality of latch holes and a slide for the industrial computer rack for connecting an industrial computer rack and an industrial computer, and the industrial computer rack being a rectangular box comprised of a plurality of frameworks and a plurality of side panels, the frameworks comprising a plurality of vertically erected frameworks, and each vertically erected framework having the latch holes, and the slide for the industrial computer rack being horizontally installed between the vertically erected frameworks, comprising:

a telescopic frame, comprised of a first moving part and a second moving part, and the first moving part having a containing space formed therein for movably installing the second moving part therein, so that the second moving part is moveable with respect to the first moving part to adjust a length of the telescopic frame;

a pair of fastener sets, installed at two end portions of the telescopic frame respectively for horizontally mounting the telescopic frame between the frameworks, and each fastener set having a base corresponding to the latch holes of the frameworks, and each base having a pair of fasteners disposed on an end surface of the base, and the fasteners are movably adjusted according to a size of the latch holes and being embedded into the latch holes respectively;

a slide set, including an outer rail, at least one inner rail and a plurality of balls, and the outer rail being installed into the telescopic frame, and the inner rail being installed inside the outer rail, and the plurality of balls being clamped between the outer rail and the inner rail, such that the inner rail is extended and retracted horizontally with respect to the outer rail, and the outer rail having a guide groove formed on an inner side of the outer rail, a positioning portion formed at an end portion of the guide groove, and the inner rail having a moving groove formed on an exterior of the inner rail and corresponding to the industrial computer, a slide stopper disposed in the moving groove, and a latch block disposed with an interval from a side of the inner rail and opposite to the slide stopper;

an automatic locking module, including a slide block, a pressing plate and a first elastic element, and the slide block being slidably disposed and limited in the guide groove, and the pressing plate being installed outside the guide groove for pressing and preventing the slide block from falling out when the slide block is moving in the guide groove, and an end of the first elastic element being fixed to a side of the positioning portion, and an another end of the first elastic element being coupled to the slide block, so that after the slide block is triggered by the inner rail, the slide block is automatically locked to a set position in the outer rail; and a release module, including a U-shaped rail, a release rod and a fixed block, and a side of the U-shaped rail being movably disposed across an edge of the second moving part, and the release rod and the fixed block being disposed at a top of the U-shaped rail, and the release rod being situated at an anterior position of the U-shaped rail, and the fixed block being disposed with an interval from a side of the release rod, so that after the fixed block is clamped by the slide stopper and the latch block, the fixed block coupled to the inner rail, and when use, the release rod pushes the slide stopper to move, and the U-shaped rail is removable from the second moving part, wherein each of the fastener includes a moving block, a central column and a second elastic element, and the moving block is movably disposed in an opening formed on an end surface of the base and an interior of the moving block is connected to the second elastic element, and a penetrating hole is formed at a center of the moving block for sheathing the central column, so that the moving block is extended or retracted with respect to the base, and when the moving block is retracted, the central column is exposed, wherein the moving block is divided into a first section and a second section arranged in a cascade form, and the first section is a rectangular block, and the second section is a cylindrical block, and the opening is in a rectangular shape for accommodating a portion of the first section, and the second section is normally exposed to the outside, and a first embedding groove is formed on a surface of the first section, and a second embedding groove is formed on a surface of the second section, and the first embedding groove or the second embedding groove is embedded into the latch hole.

2. The industrial computer rack and the slide for the industrial computer rack according to claim 1, wherein the first moving part and the second moving part are C-shaped metal troughs, and the second moving part is smaller than the first moving part.

3. The industrial computer rack and the slide for the industrial computer rack according to claim 1, wherein the inner rail has a trigger block corresponding to the slide block, and the slide block has a notch portion disposed at a periphery of the slide block and corresponding to the trigger block, and after the trigger block pushes the slide block to turn, the trigger block falls into the notch portion, and the slide block is pulled by the first elastic element to slide in the guide groove, so as to pull the inner rail to be received automatically.

4. The industrial computer rack and the slide for the industrial computer rack according to claim 1, wherein the slide stopper is disposed slantingly in the moving groove and tilted towards an inner end of the slide set.

5. The industrial computer rack and the slide for the industrial computer rack according to claim 4, wherein the release rod has an abutting portion slantingly bent and disposed at a position corresponding to an end portion of the fixed block, and the abutting portion is tilted towards an outer end of the slide set and provided for abutting the slide stopper to displace upwardly.

* * * * *